US012580008B2

(12) United States Patent
Kumar et al.

(10) Patent No.: US 12,580,008 B2
(45) Date of Patent: Mar. 17, 2026

(54) POWER GATING CIRCUIT WITH MEMORY PRECHARGE SUPPORT

(71) Applicant: Arm Limited, Cambridge (GB)

(72) Inventors: Akshay Kumar, New Delhi (IN);
Edward Martin McCombs, Jr.,
Austin, TX (US)

(73) Assignee: ARM LIMITED, Cambridge (GB)

( * ) Notice: Subject to any disclaimer, the term of this patent is extended or adjusted under 35 U.S.C. 154(b) by 112 days.

(21) Appl. No.: 18/436,422

(22) Filed: Feb. 8, 2024

(65) Prior Publication Data

US 2025/0259659 A1    Aug. 14, 2025

(51) Int. Cl.
*G11C 5/14* (2006.01)

(52) U.S. Cl.
CPC ................................... *G11C 5/148* (2013.01)

(58) Field of Classification Search
CPC ..................................................... G11C 5/148
See application file for complete search history.

(56) References Cited

U.S. PATENT DOCUMENTS

| | | | |
|---|---|---|---|
| 6,181,608 B1 | 1/2001 | Keshavarzi et al. | |
| 6,181,612 B1 | 1/2001 | Wada | |
| 6,269,096 B1 * | 7/2001 | Hann ................. | H04Q 11/0478 |
| | | | 370/395.72 |

| | | | |
|---|---|---|---|
| 2001/0043482 A1 | 11/2001 | Takeyama et al. | |
| 2015/0009772 A1 * | 1/2015 | Chen ...................... | G11C 5/148 |
| | | | 365/227 |
| 2020/0098422 A1 | 3/2020 | Nguyen et al. | |
| 2021/0027833 A1 | 1/2021 | Chowdhury et al. | |
| 2021/0193196 A1 | 6/2021 | Augustine et al. | |
| 2023/0206995 A1 | 6/2023 | Schreiber et al. | |

FOREIGN PATENT DOCUMENTS

| | | | |
|---|---|---|---|
| JP | 2019050068 A | * | 3/2019 |
| WO | 2023034370 A1 | | 3/2023 |

OTHER PUBLICATIONS

Corrected Notice of Allowability issued in U.S. Appl. No. 18/436,147, mailed Mar. 24, 2025, 3 pages.

* cited by examiner

*Primary Examiner* — Sultana Begum
(74) *Attorney, Agent, or Firm* — Talem IP Law, LLP

(57)    ABSTRACT

A power gating circuit for a memory includes a plurality of header switches, the plurality of header switches comprising: a first transistor having a source tied to an external power supply line; and a second transistor coupled to a drain of the first transistor and having its own drain coupled to an internal voltage line of the memory, wherein the second transistor is structured to be used as a transistor or a diode based on control of a gate of the second transistor; and a selection device coupled to the gate of the second transistor to controllably couple the gate of the second transistor in a first state to the drain of the second transistor for diode operation and in a second state to a second voltage line for transistor operation.

18 Claims, 5 Drawing Sheets

POWER GATING CIRCUIT WITH MEMORY PRECHARGE SUPPORT

BACKGROUND

Power gating typically uses low-leakage PMOS transistors as header switches to shut off power supplies to parts of a chip in standby or sleep mode. NMOS footer switches can also be used as sleep transistors to support sleep mode. Inserting the sleep transistors splits the chip's power network into a permanent power network connected to the power supply and a virtual power network that drives the cells and can be turned off.

When power gating is used, the system may include some form of state retention, such as scanning out data to a RAM, then scanning the data back in when the system is reawakened. Retention registers can be used, which are low leakage flip-flops used to hold the data of a main register of the power gated block. A power gating controller can be used to control the retention mechanism along with changing of the power gating modes.

BRIEF SUMMARY

Power gating circuits with memory precharge support are described. By being able to connect diodes to provide a reduced power supply through a power gating circuit, leakage can be further reduced, which supports efficient precharge.

A power gating circuit for a memory includes a plurality of header switches, the plurality of header switches comprising: a first transistor having a source tied to an external power supply line; and a second transistor coupled to a drain of the first transistor and having its own drain coupled to an internal voltage line of the memory, wherein the second transistor is structured to be used as a transistor or a diode based on control of a gate of the second transistor; and a selection device coupled to the gate of the second transistor to controllably couple the gate of the second transistor in a first state to the drain of the second transistor for diode operation and in a second state to a second voltage line for transistor operation.

A method of operating such a power gating circuit can include maintaining an internal voltage line of the memory at a first voltage based on a diode drop level by operating the selection device to couple the gate of the second transistor in the first state to the drain of the second transistor, wherein the first transistor is ON; receiving a signal triggering a wake-up sequence; and in response to receiving the signal triggering the wake-up sequence, operating the selection device to couple the gate of the second transistor in the second state to the second voltage line.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Power gating circuits with memory precharge support are described. By being able to connect diodes to provide a reduced power supply through a power gating circuit, leakage can be further reduced, which supports efficient precharge.

Memory circuitry, such as for caches, may be designed to have the best leakage (i.e., optimized for minimal leakage) in retention mode, where the memory is intended to stay most of the time. The usage model of certain memory, including system level caches, involves waking up out of retention mode inside one CLK cycle, and then doing an operation in 1-5 cycles, and then going back into retention mode. Consequently, it can be seen that a wake-up from retention mode must happen within one clock cycle. In some cases, the size of the memory is so large that precharging the core array power supply from a diode drop voltage (to optimize leakage) to the full rail is the dominating component of this wake-up time.

Advantageously, a power gating circuit is provided that enables fast wake-up from retention mode.

Figure 1:
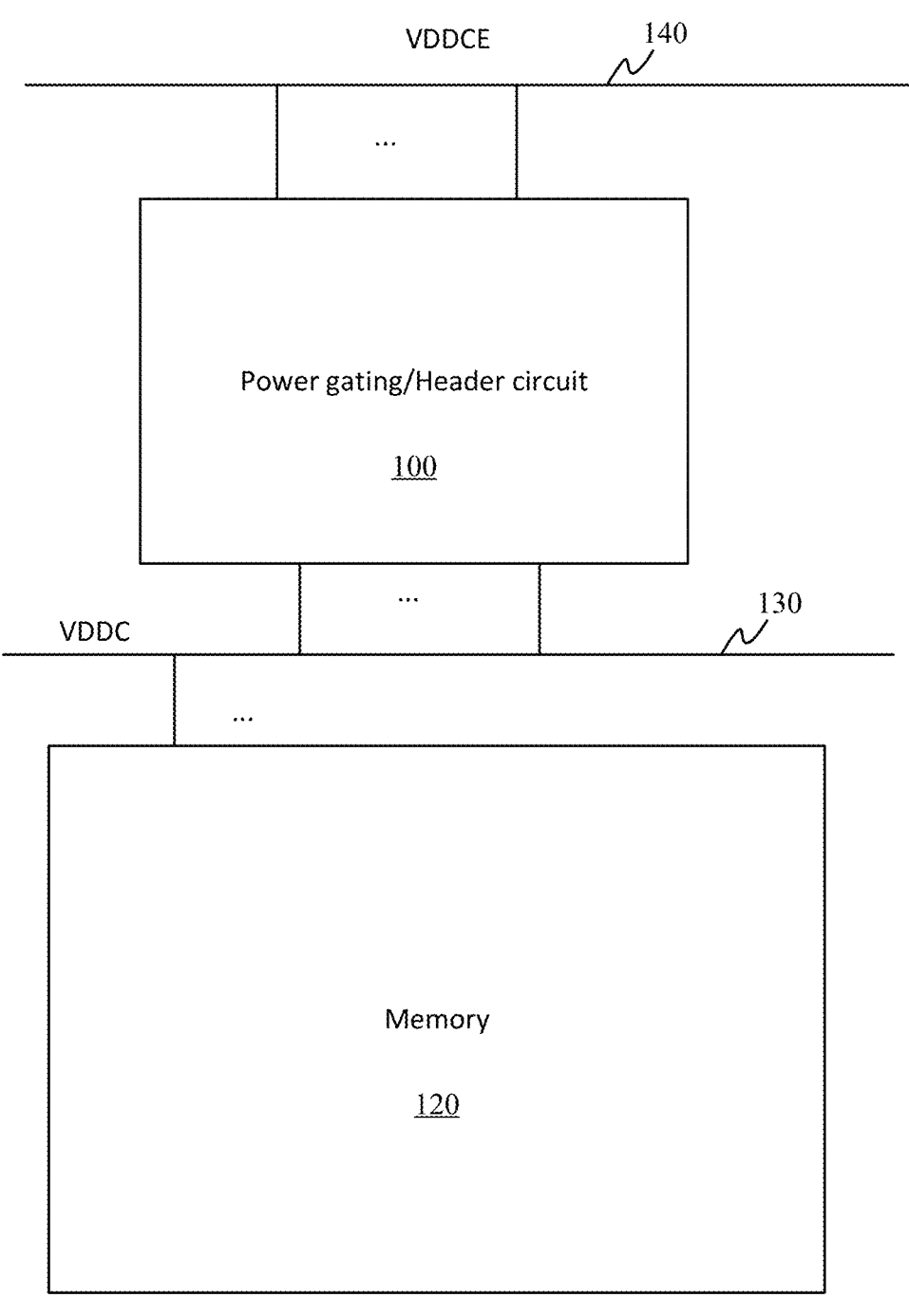
FIG. 1 shows a representative diagram of a power gating circuit for memory.

FIG. 1 shows a representative diagram of a power gating circuit for memory. Referring to FIG. 1, a power gating circuit 100 can be used to control how memory 120 is connected to an external power supply. That is, the value of voltage VDDC 130 supplied to the memory 120 can be controlled, in part, by the power gating of the voltage VDDCE 140 of the external power supply by the power gating circuit 100. The circuitry and operation of power gating circuit 100 can be designed for reducing leakage and providing different modes of operation. The memory 120 can be a cache memory.

Figure 2:
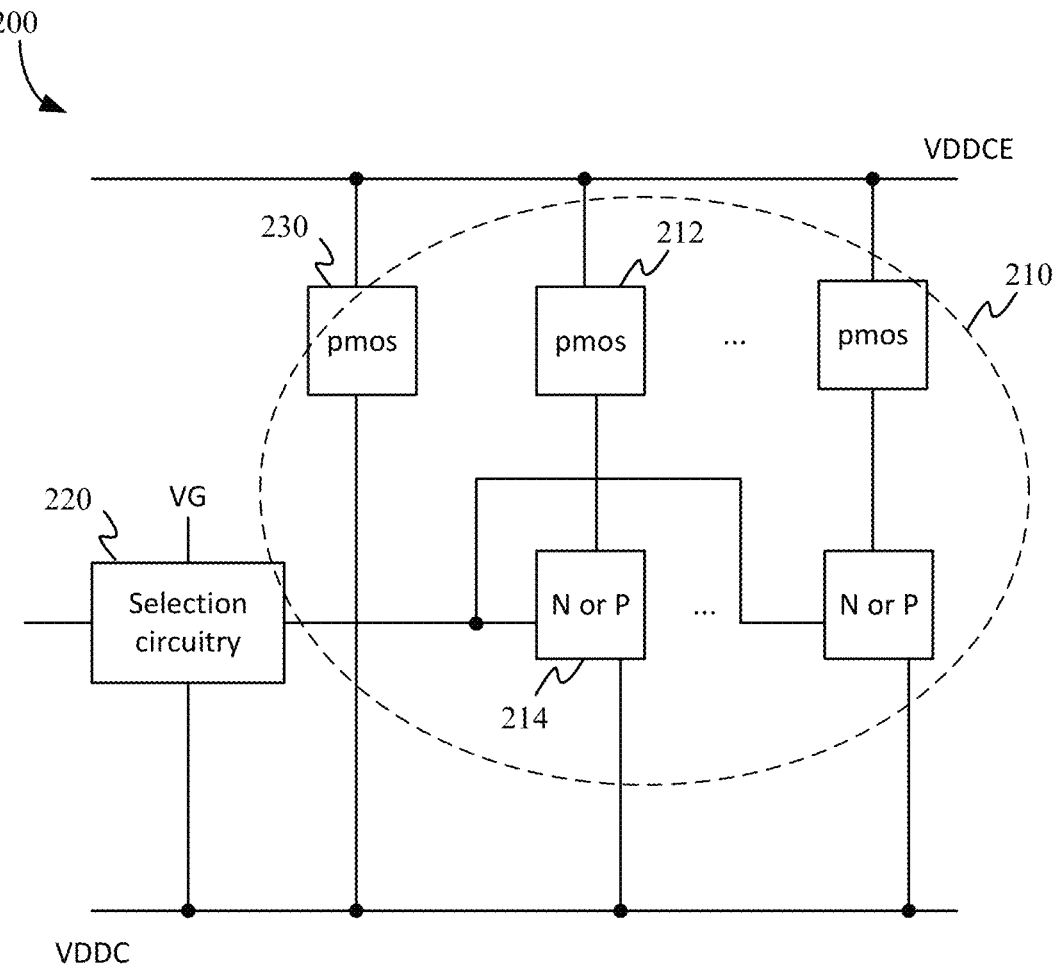
FIG. 2 shows a block diagram example power gating circuit.

FIG. 2 shows a block diagram example power gating circuit. Referring to FIG. 2, a power gating circuit 200 for a memory (e.g., memory 120 of FIG. 1) includes a plurality of header switches 210. The plurality of header switches include a first transistor 212 having a source tied to an external power supply (VDDCE) line; and a second transistor 214 coupled to a drain of the first transistor 212 and having its own drain coupled to an internal voltage line (VDDC) of the memory. The second transistor is structured to be used as a transistor or a diode based on control of a gate of the second transistor 214. The power gating circuit 200 further includes a selection device 220 coupled to the gate of the second transistor 214 to controllably couple the gate of the second transistor 214 in a first state to the drain of the second transistor 214 for diode operation and in a second state to a second voltage line (VG) for transistor operation. The selection device 220 is operated to cause the second state in a precharge mode for the memory. Advantageously, the reconfigurability of the second transistor(s) between being in a diode configuration and being turned off by connection of the gates to a full-rail voltage (e.g., VDD for PMOS and VSS for NMOS) allows for further reduction in leakage when not in the diode configuration. Additionally, when the second transistor(s) is turned on by connection of the gates to a full-rail voltage (e.g., VSS for PMOS and VDD for NMOS), this can assist with the precharging operations of the memory (e.g., for precharging bitlines and precharging sense amplifiers).

As also shown in FIG. 2, the plurality of header switches 210 can further include a header transistor 230 having a source coupled to the external power supply line (VDDCE) and a drain coupled to the internal voltage line (VDDC) of the memory. The header transistor 230 can be a larger size (e.g., width of channel) than the first transistor 212.

Figure 3A:
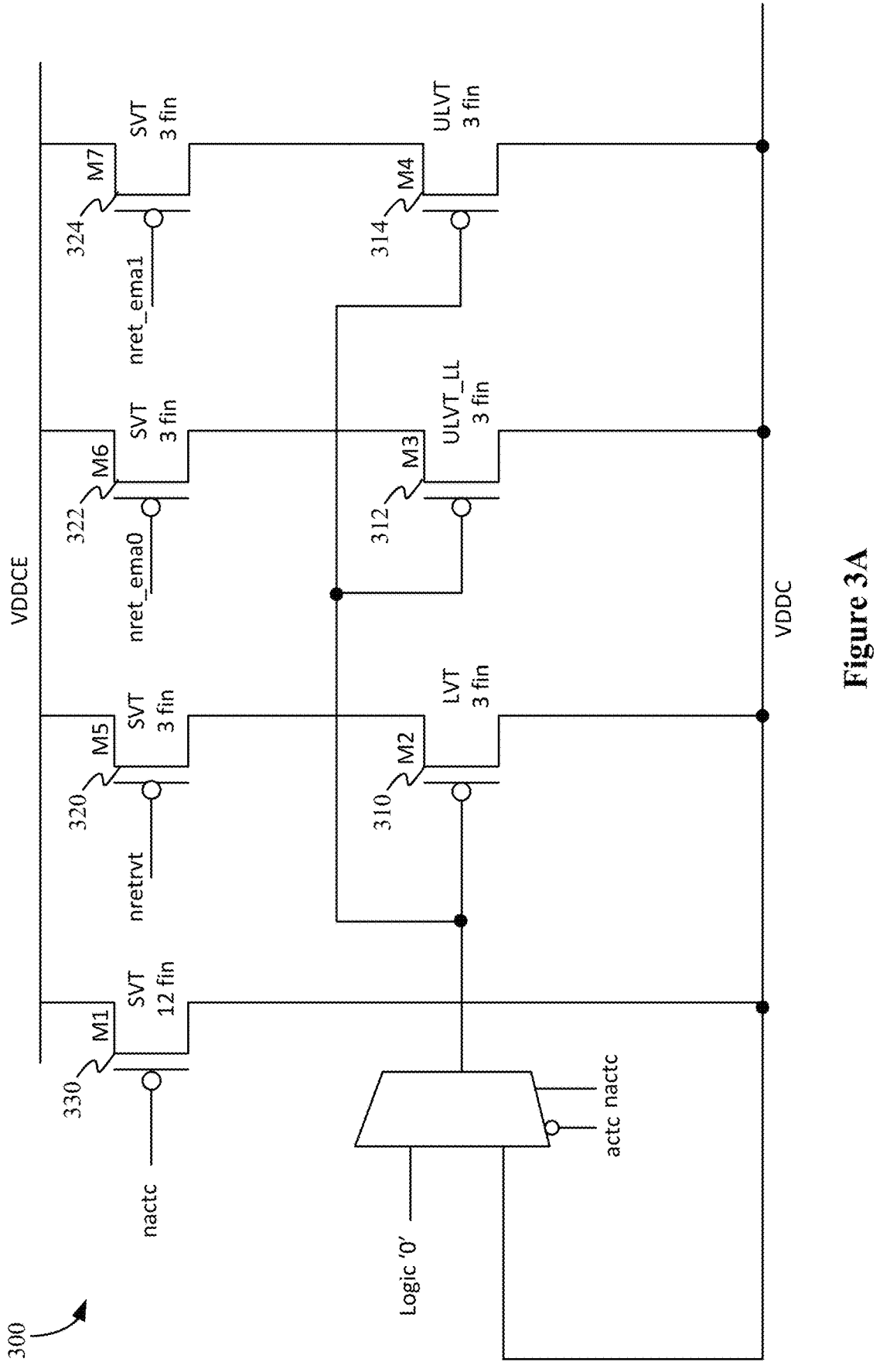
FIGS. 3A and 3B show example implementations of a power gating circuit.

The selection device 220 can be a multiplexer (MUX) receiving signals from a controller (see e.g., FIG. 3A). In some cases, pass gates can be used as the MUX (see e.g., FIG. 3B). The selection device 220 can be a controller. In some cases, each second transistor (when provided in plurality) has a separate control. In such cases, it can be possible to only turn on one diode instead of all.

The plurality of header switches 210 can all be PMOS transistors. Alternatively, the first transistor 212 can be a PMOS transistor and the second transistor 214 can be a NMOS transistor.

In addition, more than one first and second transistor can be provided. These additional first and second transistors may be independently controllable. For example, the first transistor 212 can be provided in plurality with a corresponding second transistor 214, wherein each of the header switches are of different sizes, the first transistor being a largest of the header switches. Indeed, as illustrated in FIGS. 3A and 3B, different Vt types are demonstrated to allow for different precharge times and/or different retention voltages through different diode types.

Figure 3B:
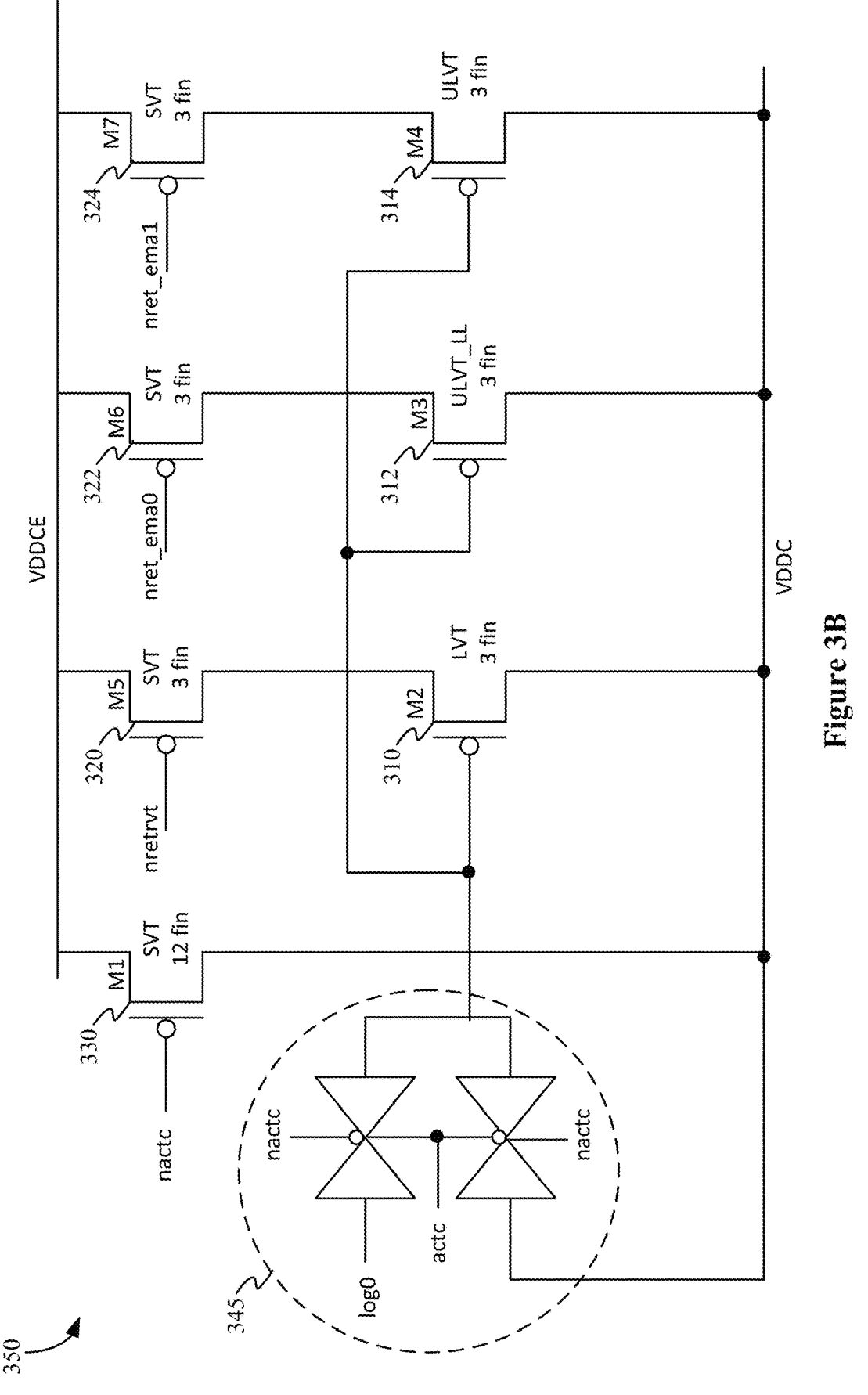
Figure 4:
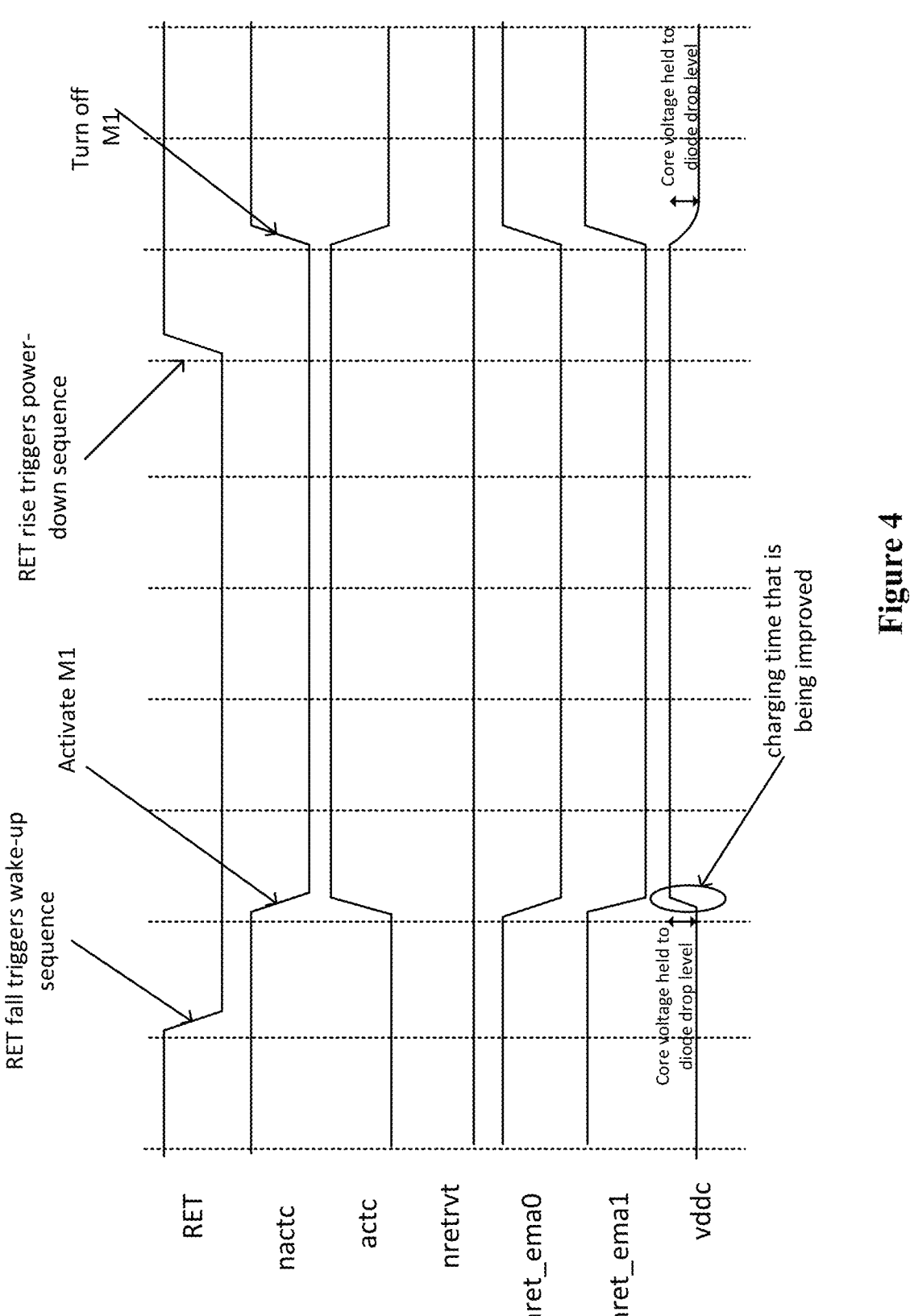
FIG. 4 shows timing diagrams for operation of an example power gating circuit with memory precharge support.

FIGS. 3A and 3B show example implementations of a power gating circuit; and FIG. 4 shows timing diagrams for operation of an example power gating circuit with memory precharge support.

Referring to FIGS. 3A and 3B, in the header circuit 300, 350, there are three diodes (formed by second transistors 310, 312, 314) that offer different diode drop voltages (selected by first transistors 320, 322, 324 using corresponding signals nretrvt, nret_ema0, and nret_ema1), and a header transistor 330 that is responsible for pre-charging the internal power supply (vddc) to a core memory array. For example, as shown in a first time period in FIG. 4, nretrvt is low (to turn ON first transistor 320) and nret_ema0 and nret_ema1 are high (such that transistors 322, 324 are OFF) to hold the core voltage (VDDC) to a diode drop level of the first diode provided by second transistor 310. In this configuration, the second transistors 310, 312, 314 are each connected as diodes, with drain-gate shorted by selection of MUX 340 of FIG. 3A or, in a specific implementation, pass gates 345 of FIG. 3B, for example, using the control signal to the header transistor 330 of nactc, which is asserted high and provided along with a low actc as selection device control signals.

When the RET signal is asserted low (signal not shown in FIGS. 3A and 3B), the wake-up sequence is triggered. Typically, for a wake-up sequence, the diodes turn off and it is the job of the core header (e.g., header transistor 330) to precharge the core array power supply. However, by using a circuit such as shown in FIGS. 2, 3A, and 3B, it is possible to speed up the process of precharging the core array power supply by using the second transistors 310, 312, 314 not as diodes but as additional headers to provide additional support to the header transistor 330 and help make the precharging time faster.

In particular, the nactc can be asserted signal low, which disconnects the passgate/MUX that provides the diode-like configuration to the gates of the second transistors 310, 312, 314, and instead provides a logic 0 to the gates, allowing the diodes to act as header transistors and help precharge the circuit with a higher drive strength (and improving charging time to bring VDDC from the lower diode drop level to the higher voltage level). Indeed, as can be seen, instead of disconnecting diodes, after RET triggers the wake-up sequence, the second transistors 310, 312, 314 are all turned on (with nretrvt, nret_ema0, and nret_ema1 all low to turn ON first transistors 320, 322, 324) with gates connected to logic 0 with the selection device input signal of nactc being low and actc being high. Accordingly, in response to receiving the RET signal triggering the wake-up sequence, the header transistor can be activated and the same control signal activating the header transistor also operates the selection device to couple the gate of the second transistor to the logic 0 (e.g., by a second voltage line).

When RET is asserted high to trigger a power-down sequence, the nactc signal is asserted high, which re-enables the diode configuration, and allows the core voltage to drop to the diode level instead, for example, as shown in the final cycles shown in FIG. 4.

Accordingly, a method of operating a power gating circuit such as described herein can include maintaining an internal voltage line of the memory at a first voltage based on a diode drop level by operating the selection device to couple the gate of the second transistor in the first state to the drain of the second transistor, wherein the first transistor is ON; receiving a signal triggering a wake-up sequence; and in response to receiving the signal triggering the wake-up sequence, operating the selection device to couple the gate of the second transistor in the second state to the second voltage line. In this manner, the "diodes" can be converted to transistors and used to improve charging time during wake-up.

Certain embodiments of the illustrated methods and circuitry include the following.

Clause 1. A power gating circuit for a memory, comprising: a plurality of header switches, the plurality of header switches comprising: a first transistor having a source tied to an external power supply line; and a second transistor coupled to a drain of the first transistor and having its own drain coupled to an internal voltage line of the memory, wherein the second transistor is structured to be used as a transistor or a diode based on control of a gate of the second transistor; and a selection device coupled to the gate of the second transistor to controllably couple the gate of the second transistor in a first state to the drain of the second transistor for diode operation and in a second state to a second voltage line for transistor operation.

Clause 2. The power gating circuit of clause 1, wherein the selection device is operated to cause the second state in a precharge mode for the memory.

Clause 3. The power gating circuit of clause 1 or 2, wherein the plurality of header switches further comprises: a header transistor having a source coupled to the external power supply line and a drain coupled to the internal voltage line of the memory, the header transistor being a larger size than the first transistor.

Clause 4. The power gating circuit of any preceding clause, wherein the selection device comprises a multiplexer receiving signals from a controller.

Clause 5. The power gating circuit of any of clauses 1-3, wherein the selection device comprises a controller.

Clause 6. The power gating circuit of any preceding clause, wherein the plurality of header switches are PMOS transistors.

Clause 7. The power gating circuit of any preceding clause, wherein the first transistor is a PMOS transistor.

Clause 8. The power gating circuit of any preceding clause, wherein the second transistor is a NMOS transistor.

Clause 9. The power gating circuit of any preceding clause, wherein the first transistor is provided in plurality with a corresponding second transistor, wherein each of the header switches are of different sizes, the first transistor being a largest of the header switches.

Clause 10. A method of operating a power gating circuit for memory, the power gating circuit being according to any preceding clause, the method comprising: maintaining an internal voltage line of the memory at a first voltage based on a diode drop level by operating the selection device to couple the gate of the second transistor in the first state to the drain of the second transistor, wherein the first transistor is ON; receiving a signal triggering a wake-up sequence; and in response to receiving the signal triggering the wake-up sequence, operating the selection device to couple the gate of the second transistor in the second state to the second voltage line.

Clause 11. The method of clause 10, further comprising: receiving a signal triggering a power-down sequence; and in response to receiving the signal triggering the power-down sequence, operating the selection device to couple the gate of the second transistor in the first state to the drain of the second transistor.

Clause 12. The method of clause 10 or 11, wherein the power gating circuit further comprises a header transistor having a source coupled to the external power supply line and a drain coupled to the internal voltage line of the memory, the header transistor being a larger size than the first transistor, wherein the method further comprises: in response to receiving the signal triggering the wake-up sequence, activating the header transistor, wherein a control signal activating the header transistor also operates the selection device to couple the gate of the second transistor in the second state to the second voltage line, wherein both the header transistor and the first transistor are ON.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts that would be recognized by one skilled in the art are intended to be within the scope of the claims.

What is claimed is:

1. A power gating circuit for a memory, comprising:
a plurality of header switches, the plurality of header switches comprising:
    a first transistor having a source tied to an external power supply line; and
    a second transistor coupled to a drain of the first transistor and having its own drain coupled to an internal voltage line of the memory, wherein the second transistor is structured to be used as a transistor or a diode based on control of a gate of the second transistor;
    a header transistor having a source coupled to the external power supply line and a drain coupled to the internal voltage line of the memory, the header transistor being a larger size than the first transistor; and
a selection device coupled to the gate of the second transistor to controllably couple the gate of the second transistor in a first state to the drain of the second transistor for diode operation and in a second state to a second voltage line for transistor operation.

2. The power gating circuit of claim 1, wherein the selection device is operated to cause the second state in a precharge mode for the memory.

3. The power gating circuit of claim 1, wherein the selection device comprises a multiplexer receiving signals from a controller.

4. The power gating circuit of claim 1, wherein the selection device comprises a controller.

5. The power gating circuit of claim 1, wherein the plurality of header switches are PMOS transistors.

6. The power gating circuit of claim 1, wherein the first transistor is a PMOS transistor.

7. The power gating circuit of claim 1, wherein the second transistor is a NMOS transistor.

8. The power gating circuit of claim 1, wherein the first transistor is provided in plurality with a corresponding second transistor, wherein the plurality of corresponding second transistors have different threshold voltages (Vt) to provide different retention voltages.

9. A method of operating a power gating circuit for memory comprising a plurality of header switches, the plurality of header switches comprising: a first transistor having a source tied to an external power supply line; and a second transistor coupled to a drain of the first transistor and having its own drain coupled to an internal voltage line of the memory, wherein the second transistor is structured to be used as a transistor or a diode based on control of a gate of the second transistor; and a selection device coupled to the gate of the second transistor to controllably couple the gate of the second transistor in a first state to the drain of the second transistor for diode operation and in a second state to a second voltage line for transistor operation, the method comprising:
    maintaining an internal voltage line of the memory at a first voltage based on a diode drop level by operating the selection device to couple the gate of the second transistor in the first state to the drain of the second transistor, wherein the first transistor is ON;
    receiving a signal triggering a wake-up sequence; and
    in response to receiving the signal triggering the wake-up sequence, operating the selection device to couple the gate of the second transistor in the second state to the second voltage line.

10. The method of claim 9, further comprising:
    receiving a signal triggering a power-down sequence; and
    in response to receiving the signal triggering the power-down sequence, operating the selection device to couple the gate of the second transistor in the first state to the drain of the second transistor.

11. The method of claim 9, wherein the power gating circuit further comprises a header transistor having a source coupled to the external power supply line and a drain coupled to the internal voltage line of the memory, the header transistor being a larger size than the first transistor, wherein the method further comprises:
    in response to receiving the signal triggering the wake-up sequence, activating the header transistor, wherein a control signal activating the header transistor also operates the selection device to couple the gate of the second transistor in the second state to the second voltage line, wherein both the header transistor and the first transistor are ON.

12. A power gating circuit for a memory, comprising:
a plurality of header switches, the plurality of header switches comprising:
    a first transistor having a source tied to an external power supply line; and
    a second transistor coupled to a drain of the first transistor and having its own drain coupled to an internal voltage line of the memory, wherein the second transistor is structured to be used as a transistor or a diode based on control of a gate of the second transistor;

at least one additional first transistor having a source tied to the external power supply line; and at least one additional second transistor coupled to a drain of a corresponding one of the at least one additional first transistor and having its own drain coupled to the internal voltage line of the memory, wherein each of the at least one additional second transistor is structured to be used as a transistor or a diode based on control of a gate of that additional second transistor, wherein the second transistor and the at least one additional second transistor comprise transistors of different sizes; and a selection device coupled to the gate of the second transistor and each of the at least one additional second transistor to controllably couple the gate of the second transistor and each of the at least one additional second transistor in a first state to their corresponding drains for diode operation and in a second state to a second voltage line for transistor operation.

13. The power gating circuit of claim 12, wherein the selection device provides separate control for each of the second transistor and at least one additional second transistor.

14. The power gating circuit of claim 12, wherein the selection device is operated to cause the second state in a precharge mode for the memory.

15. The power gating circuit of claim 12, wherein the selection device comprises a multiplexer receiving signals from a controller.

16. The power gating circuit of claim 12, wherein the selection device comprises a controller.

17. The power gating circuit of claim 12, wherein the first transistor and the at least one additional first transistor are PMOS transistors.

18. The power gating circuit of claim 17, wherein the second transistor and the at least one additional second transistor are NMOS transistors.

* * * * *